United States Patent
Ohta et al.

[11] Patent Number: 5,901,046
[45] Date of Patent: May 4, 1999

[54] SURFACE MOUNT TYPE PACKAGE UNIT AND METHOD FOR MANUFACTURING THE SAME

[75] Inventors: Tameharu Ohta, Nishio; Takashi Yamasaki; Kenichi Gohara, both of Kokubu, all of Japan

[73] Assignee: Denso Corporation, Kariya, Japan

[21] Appl. No.: 08/988,402

[22] Filed: Dec. 10, 1997

[30] Foreign Application Priority Data

Dec. 10, 1996 [JP] Japan .................................. 8-329819

[51] Int. Cl.⁶ ........................................................ H05K 7/02
[52] U.S. Cl. ........................... 361/760; 361/748; 361/763; 361/767; 361/764; 361/783; 73/514.35; 73/514.01; 174/260; 174/250; 174/255; 174/52.5; 257/723; 257/724; 438/53
[58] Field of Search ..................................... 361/728, 736, 361/737, 743, 748, 763, 767, 772, 764, 783; 257/723, 724; 174/260, 250, 255, 52.5; 438/53

[56] References Cited

U.S. PATENT DOCUMENTS

| | | | |
|---|---|---|---|
| 5,212,345 | 5/1993 | Gutierrez | 174/52.5 |
| 5,343,748 | 9/1994 | Mozgowiec et al. | 73/497 |
| 5,345,823 | 9/1994 | Reidemeister et al. | 73/517 R |
| 5,471,089 | 11/1995 | Nagatomo et al. | 257/691 |
| 5,554,806 | 9/1996 | Mizuno et al. | 73/493 |
| 5,693,883 | 12/1997 | Giroud et al. | 73/514.24 |
| 5,734,106 | 3/1998 | Caillat | 73/14.01 |

Primary Examiner—Leo P. Picard
Assistant Examiner—David Foster
Attorney, Agent, or Firm—Pillsbury, Madison & Sutro LLP

[57] ABSTRACT

A package body holding an acceleration sensor circuit therein has signal electrodes and four dummy electrodes insulated from the signal electrode on a mounted surface thereof. The signal electrodes are electrically connected to the sensor circuit element. The mounted surface of the package body has chamfered portions on verge portions thereof, and auxiliary electrodes are formed on the chamfered portions to be integrally connected to the signal electrodes. The thus constructed package body is mounted on a circuit board by a reflow method using a solder paste so that the signal, dummy, and auxiliary electrodes are connected to a wiring pattern on the circuit board through solder portions. In this process, the solder paste on the dummy electrodes in a fused state generate an internal pressure to retain a clearance between the package body and the circuit board. As a result, the thickness of the solder portions between the package body and the circuit board can be secured, and reliability at a mounted state is improved.

21 Claims, 6 Drawing Sheets

SURFACE MOUNT TYPE PACKAGE UNIT AND METHOD FOR MANUFACTURING THE SAME

CROSS REFERENCE TO RELATED APPLICATION

This application is based upon and claims the benefit of priority of prior Japanese Patent Application No. 8-329819 filed on Dec. 10, 1996, the contents of which are incorporated herein by reference.

BACKGROUND OF THE INVENTION

1. Field of the Invention

The present invention relates to a surface mount type package unit including a package body with a signal electrode directly connected to a wiring pattern formed on a circuit board through solder, and a method for mounting the package body on the circuit board.

2. Related Arts

In recent years, a lead-less type packaging structure utilizing solder bumps has been adopted to a surface mount type package unit for a semiconductor device and the like in place of a lead-type packaging structure utilizing leads (Gullwing leads, J-leads, and the like) to comply with a requirement for a high packaging density. In the lead-less type packaging structure, a package body usually has signal electrodes on the bottom face thereof to be directly connected to a wiring pattern on a circuit board. Accordingly, a packaging density on a circuit board is increased, and, for example, as in a ball grid array (BGA) package unit, it becomes possible to significantly increase a number of electrodes on the package body. In addition, design flexibility of the circuit board can be improved.

However, in such a packaging structure, a size of the package body itself has increased due to high density integration of semiconductor devices, necessity of mounting a transducer for sensing, and the like, resulting in increase of the self-weight of the package body. As a result, the following problem is caused. That is, the package body is bonded to a circuit board through solder portions (bumps). The solder portions are generally subject to thermal stress caused by a difference in thermal expansion coefficient between the package body and the circuit board to have thermal fatigue failure therein. Further, it is generally known that increasing the thickness of the solder portions (height of the bumps) is effective to prevent the thermal fatigue failure of the solder portions.

However, in the case where the self-weight of the package body is large, the thickness of the solder portions is decreased during a fused process for mounting the package body on the circuit board. As a result, the thermal fatigue failure of the solder portions are likely to occur, resulting in deterioration of reliability at a mounted state. This problem makes the surface mount type package unit difficult to be adopted to a device such as an electric control unit for a vehicle, because such a device is used in hard environmental conditions including large change in temperature, large amount of vibrations, and the like.

On the other hand, in the lead-less surface mount type package unit, there is another problem such that it is difficult to check the bonding state of the package unit by solder from the appearance thereof. In the case where the bonding state of the package unit is checked only by an electric characteristic test, it is difficult to prevent increase of percent defective of the package unit at the mounted state. As a result, the reliability of the mounting performance of the package unit deteriorates.

SUMMARY OF THE INVENTION

The present invention has been made in view of the above-mentioned problems and an object of the present invention is to provide a surface mount type package unit having a package body mounted on a circuit board with a simple structure and high reliability, and a method for mounting the package body on the circuit board by simple processes.

According to the present invention, a package body has a signal electrode and a dummy electrode on a mounted surface thereof, and the signal and dummy electrodes are directly connected to a conductive member of a circuit board through solder. The signal electrode is electrically connected to a circuit element held on the package body. The solder between the signal electrode and the conductive member is exposed to an outside of the mounted surface of the package body when the signal electrode is joined to the conductive member. Further, a clearance between the package body and the circuit board is retained by an internal pressure generated in the solder between the dummy electrode and the conductive member. That is, the solder between the dummy electrode and the conductive member serves as a spacer. As a result, the clearance (a thickness of the solder) between the package body and the circuit board can be secured.

Preferably, the mounted surface of the package body has a chamfered portion on a verge portion thereof, and an auxiliary electrode is provided on the chamfered portion to be connected to the signal electrode. In this case, the auxiliary electrode is also joined to the circuit board through the solder so that the solder between the auxiliary electrode and the circuit board is exposed to the outside of the mounted surface.

Preferably, the dummy electrode has a circular shape. Accordingly, the internal pressure of the solder between the dummy electrode and the conductive member can be increased. The dummy electrode may includes a plurality of dummy electrode members that are arranged on the mounted surface symmetrically with respect to a center of the mounted surface.

BRIEF DESCRIPTION OF THE DRAWINGS

Other objects and features of the present invention will become more readily apparent from a better understanding of the preferred embodiments described below with reference to the following drawings.

DETAILED DESCRIPTION OF THE PREFERRED EMBODIMENTS (First Embodiment)

A first preferred embodiment according to the present invention will be described hereinunder with reference to FIGS. 1 to 11. A rectangular package body 1 shown in FIGS. 1 to 5 is constructed to be used as an acceleration sensor package, and holds therein an acceleration sensor circuit (circuit element) 2 capable of converting acceleration into an electric signal. The acceleration sensor circuit 2 includes a semiconductor sensor chip 2a having strain gauges thereon, a signal processing IC 2b for processing signals to obtain accelerator information in accordance with amounts of change in resistance of the strain gauges, and a capacitor 2c for the signal processing IC 2b, and the like.

Figure 1:
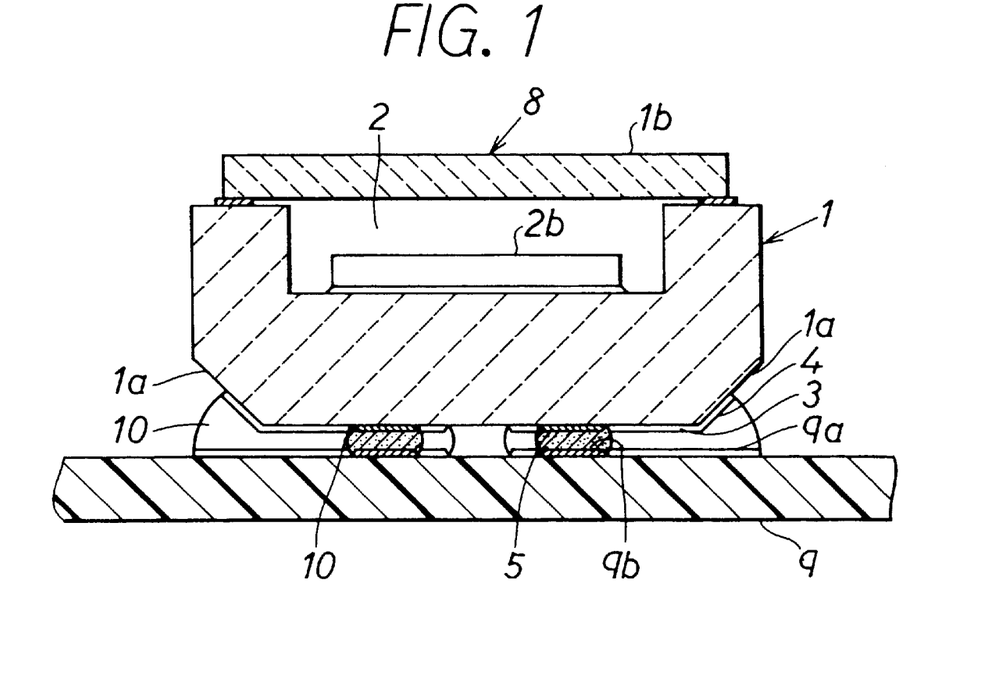
FIG. 1 is a cross-sectional view showing an acceleration sensor package in a lateral direction thereof in a preferred first embodiment according to the present invention.
Figure 3:
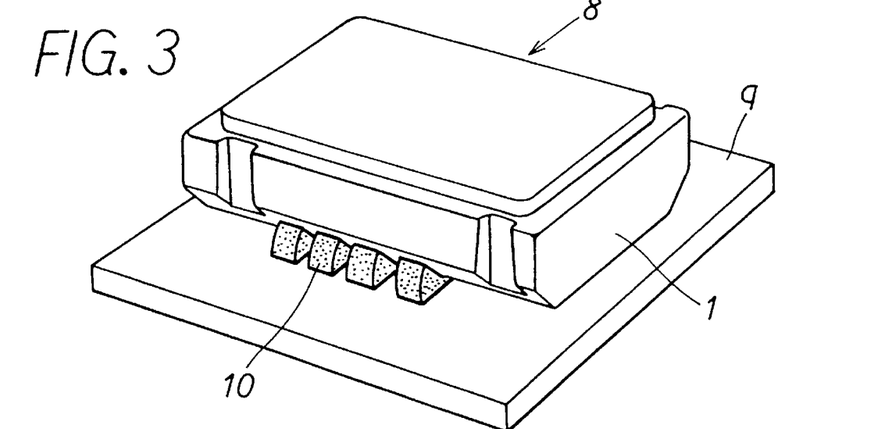
FIG. 3 is a perspective view showing the acceleration sensor package.
Figures 4, 5:
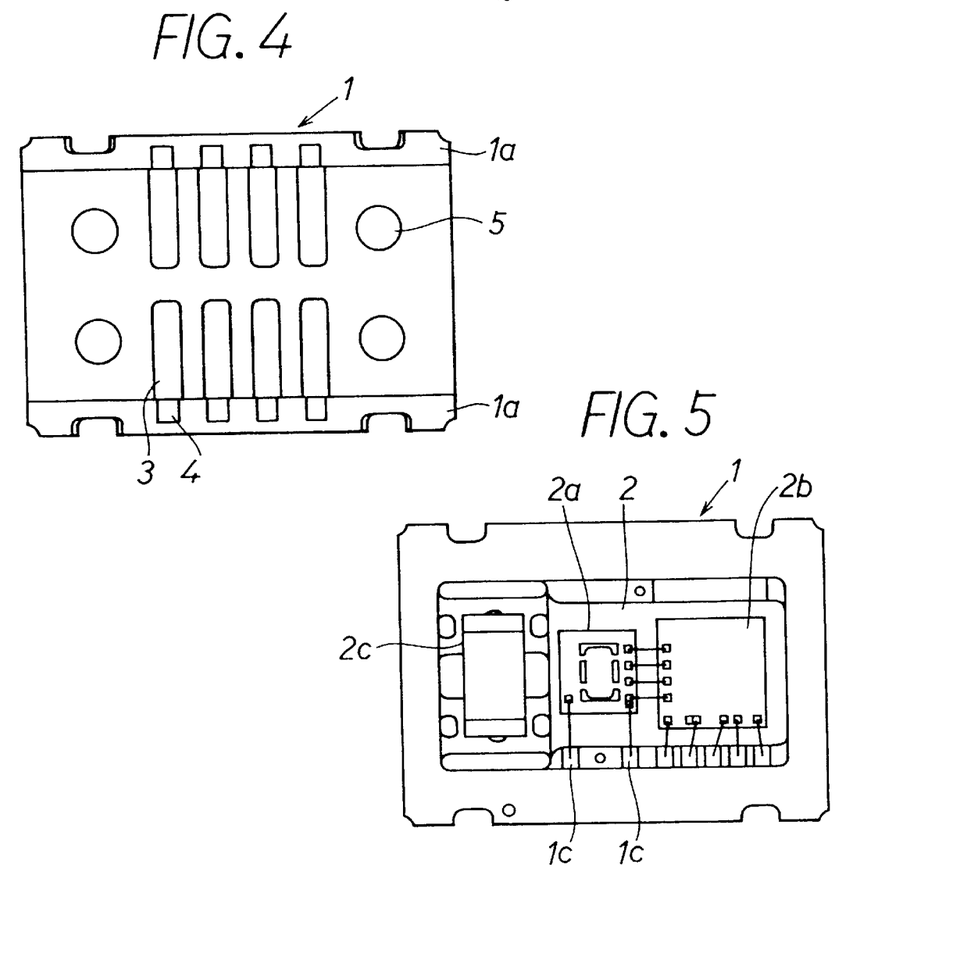
FIG. 4 is a bottom end view showing a package body of the acceleration sensor package.
FIG. 5 is a top end view showing the package body of the acceleration sensor package.

A bottom surface of the package body 1 serves as a mounted surface and has chamfered portions 1a on verge portions of both longitudinal sides thereof as shown in FIGS. 1 and 3. Each of the chamfered portions 1a has a tapered angle of approximately 45°. A plurality of signal electrodes 3 are formed on the mounted surface of the package body 1 to be electrically connected to the acceleration sensor circuit 2, and auxiliary signal electrodes 4 are formed on the chamfered portions 1a to be integrally connected to the signal electrodes 3. In this embodiment, the number of the signal electrodes 3 is eight. As shown in FIG. 4, each four of the signal electrodes 3 are arranged to be opposed to each other on both sides in a longitudinal direction of the mounted surface, while each of the signal electrodes 3 has a rectangular shape and extends to the chamfered portions 1a to be connected to a corresponding one of the auxiliary signal electrodes 4. Each of the auxiliary signal electrodes 4 also has a rectangular shape extending from edge of the mounted surface to same extent on the chamfered portions 1a.

Further, four dummy electrodes 5 having circular shapes are disposed on the mounted surface symmetrically with respect to the center of the mounted surface and adjacently to the corners thereof as shown in FIG. 4. The dummy electrodes 5 are electrically insulated from the signal electrodes 3 and from the acceleration sensor circuit 2.

In the above-mentioned structure, it should be noted that the surfaces of the auxiliary signal electrodes 4 and the dummy electrodes 5 as well as of the signal electrodes 3 have good wettability with respect to solder. A solder layer for preventing oxidization may be previously formed on the signal electrodes 3, the auxiliary signal electrodes 4, and the dummy electrodes 5. The package body 1 is made of alumina, however, it may be made of the other ceramic, plastic, glass, or the like, in place of the alumina.

Figure 6A:
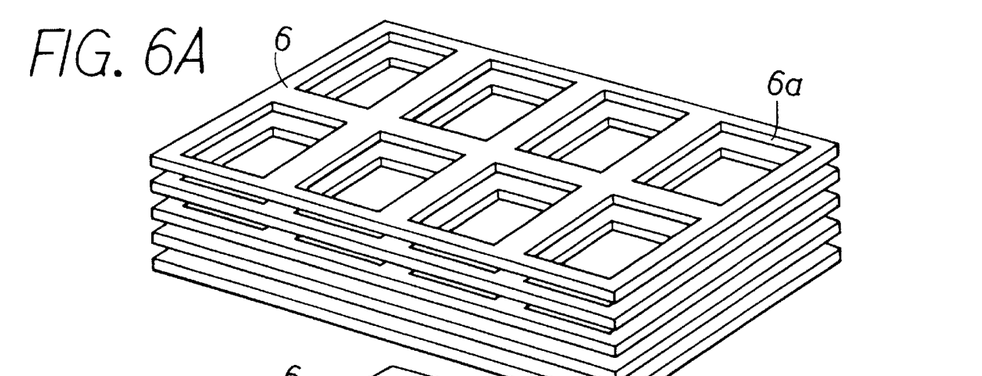
FIGS. 6A to 6D are perspective views for explaining processes of manufacturing the package body in the first embodiment.

Next, processes for manufacturing the package body 1 by using alumina will be explained referring to FIGS. 6A to 6D. The processes are performed based on a so-called green sheet laminating method (or green tape laminating method). Specifically, for example, well-known five green sheets 6 containing alumina powder, an organic binder, mineral matter powder are prepared. Then, as shown in FIG. 6A, punching holes 6a having specific shapes are formed in the upper three of the laminated green sheets 6. At the same time, via-holes (not shown) are formed in the green sheets 6 to be filled with a conducive paste.

Next, inside wiring is performed on the green sheets 6 by using the conductive paste (tungsten paste or the like) to ensure electrical connection within the package body 1 in cooperation with the via-holes. Further, electrode patterns 3a and 5a for the signal electrodes 3 and the dummy electrodes 5 are formed on a back face of one of the green sheets 6 by screen printing (refer to FIG. 6C). In FIGS. 6A to 6D, the pattern of the inside wiring is not shown.

Figure 6B:
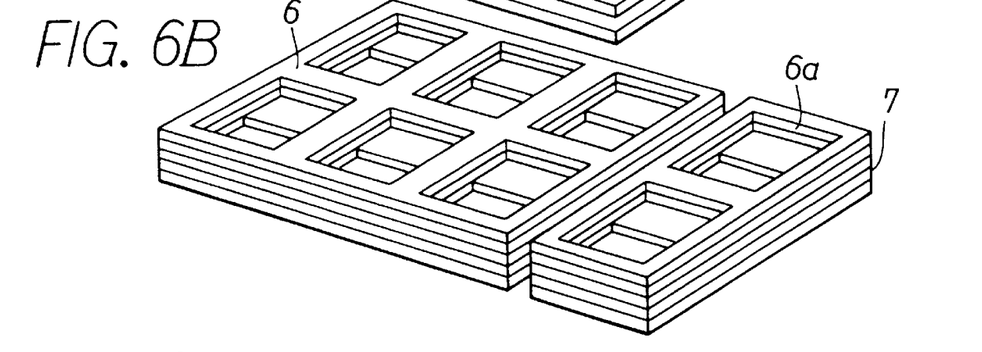
Figure 6C:
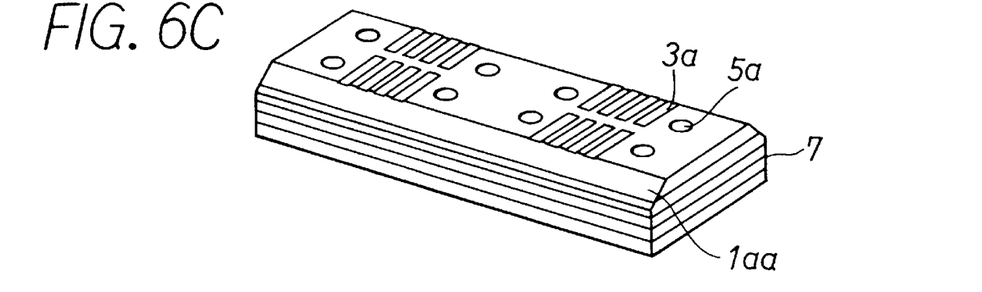

Then, the green sheets 6 are laminated and joined together by, for example, hot pressing. The thus joined green sheets 6 are divided into package base members 7 for respectively forming two package bodies 1 as shown in FIG. 6B. Further, as shown in FIG. 6C, corner portions of each of the package base members 7 (portions corresponding to the chamfered portions 1a of the package body 1) are chamfered to form chamfered portions 1aa. Then, an electrode pattern 4a for the auxiliary signal electrodes 4 is formed on the chamfered portions 1aa (refer to FIG. 6D) to be connected to the electrode pattern 3a for the signal electrodes 3 by screen-printing using a conductive paste.

Figure 6D:
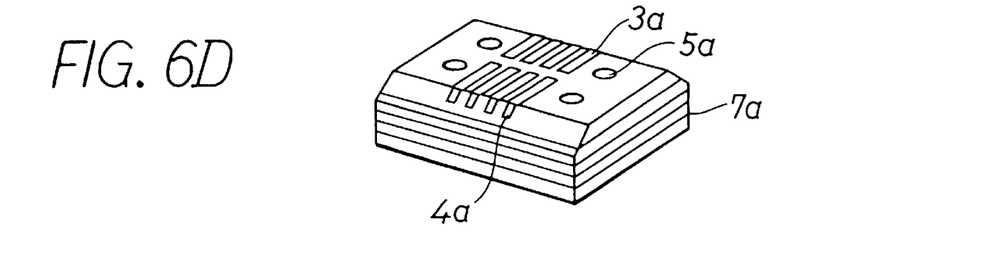

Subsequently, as shown in FIG. 6D, each of the package base members 7 is divided into two unit package base members 7a for respectively forming one package body 1. Then, the unit package base members 7a are baked at a specific temperature. Further, a plating layer including metal such as copper, gold, nickel or the like is formed on the electrode patterns 3a, 4a, and 5a so that the electrodes patterns 3a, 4a, and 5a have good solder wettability and good electrical conductivity. As a result, the package body 1 having the signal electrodes 3, the auxiliary signal electrodes 4, and the dummy electrodes 5 shown in FIG. 4 is completed.

Figure 2:
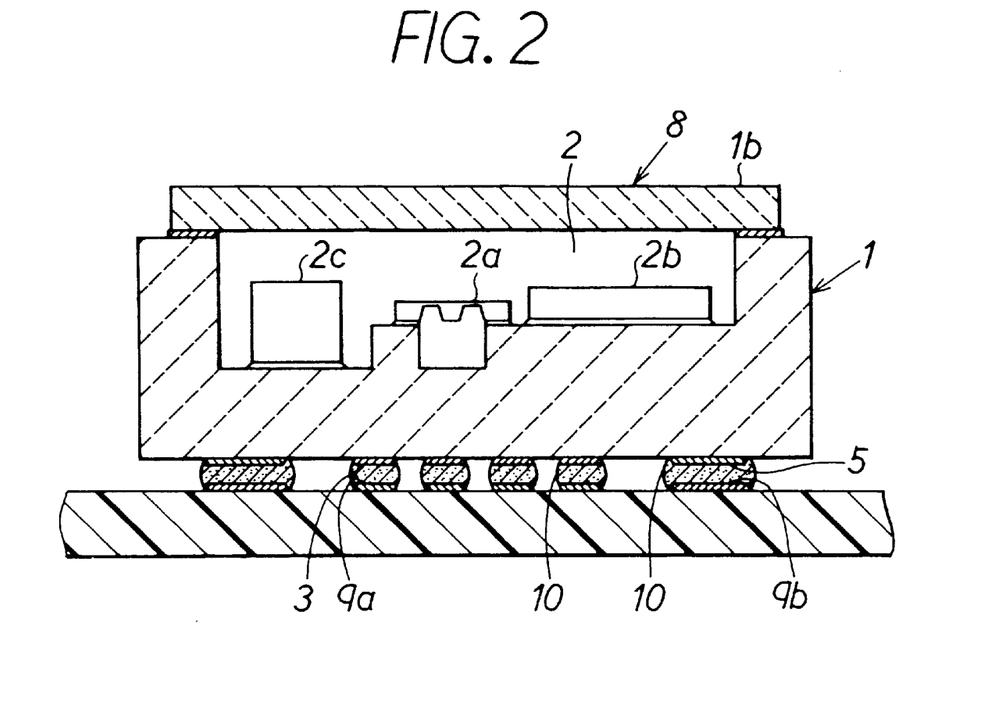
FIG. 2 is a cross-sectional view showing the acceleration sensor package in a longitudinal direction thereof.

Then, the acceleration sensor circuit 2 is mounted within the package body 1, and the opening of the package body 1 is hermetically sealed with a cover 1b shown in FIGS. 1 and 2, thereby completing an acceleration sensor package 8 shown in FIGS. 1 to 3. As shown in FIG. 5, the acceleration sensor circuit 2 is electrically connected to terminals 1c by wire bonding, while the terminals 1c are electrically connected to the signal electrodes 3 through the inside wiring pattern in the package body 1.

The thus constructed acceleration sensor package 8 is mounted on a circuit board 9 through solder portions 10 as shown in FIGS. 1 to 3. When performing the mounting, a reflow method using a solder paste is employed. That is, the circuit board 9 has thereon a wiring pattern 9a that is intended to be connected to the signal electrodes 3 and lands 9b (non-connected portions) that are intended to be connected to the dummy electrodes 5. Further, a solder paste is printed on the lands 9b and on solder parts of the wiring pattern 9a where a solder resist is removed. Then, the acceleration sensor package 8 is mounted on the circuit board 9 through the solder paste. Then, a reflow treatment using warm air, an infrared ray, or the like is performed. The solder parts of the wiring pattern 9a are formed to face the signal electrodes 3 and the auxiliary signal electrodes 4, and the lands 9b are formed to face the dummy electrodes 5 with the same shapes as the dummy electrodes 5. The lands 9b are electrically independent.

Accordingly, as shown in FIGS. 1 and 2, the signal electrodes 3, the auxiliary electrodes 4, and the dummy electrodes 5 of the package body 1 are directly connected to the wiring pattern 9a and the lands 9b on the circuit board 9 through the solder portions 10. In this case, as mentioned above, because the surfaces of the signal electrodes 3 and the auxiliary signal electrodes 4 have good solder wettability, the solder paste disposed on the solder portions of the wiring pattern 9a spreads to cover the auxiliary signal electrodes 4 during the reflow treatment.

In the case where the dummy electrodes 5 are adopted to the package body 1 as in this embodiment, the following features and effects can be obtained.

That is, in the above-mentioned reflow process, the package body 1 is subject to a force pulling the package body 1 in a lower direction in FIGS. 1 and 2. The force is caused by surface tension of the solder portions 10 on the signal electrodes 3 and by the self-weight of the acceleration sensor package 8. In the case where such a force is applied to the package body 1, the solder portions 10 between the dummy electrodes 5 and the lands 9b have barrel-like shapes as schematically shown in FIG. 7, because there is no area to spread for the solder portions 10.

Figure 7:
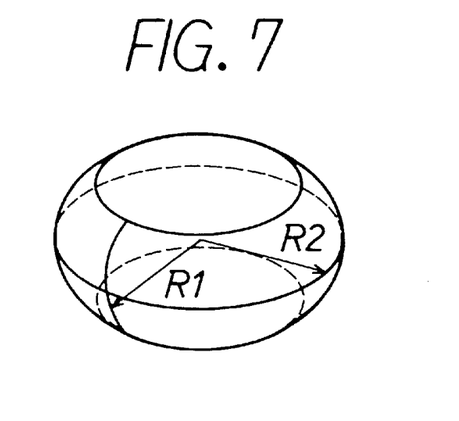
FIG. 7 is a perspective view schematically showing a shape of a solder portion on a dummy electrode in the acceleration sensor package in the first embodiment.

When each of the solder portions 10 in the fused state has the barrel-like shape as mentioned above, an internal pressure is generated in the solder portion 10 in accordance with the surface tension thereof to push the package body 1 in the upper direction in FIGS. 1 and 2. The magnitude of the internal pressure can be calculated from a Laplace-Young formula concerning a droplet. According to the Laplace-Young formula, the internal pressure Δp of the solder portion 10 (a difference in pressure between inside and outside of the solder portion 10 with respect to the surface thereof) on a corresponding one of the dummy electrodes 5 is represented by the following formula (1);

$$\Delta P = T\{(1/R1) + (1/R2)\} \quad (1)$$

wherein T represents the surface tension of the solder portion 10 on the one of the dummy electrodes 5, and R1 and R2 respectively represent radiuses of curvature of the outer circumferences in a side projective shape and in a plan projective shape (refer to FIG. 7).

The solder portion 10 between the one of the dummy electrodes 5 and one of the lands 9b has a height reduced by a thickness corresponding to an amount of the solder paste extruded out of the space between the dummy electrode 5 and the land 9b. In this case, the extruded amount of the solder paste is determined in accordance with an equilibrium condition between the internal pressures generated in the solder portions 10 on the dummy electrodes 5 (forces applied in the upper direction in FIGS. 1 and 2), and the sum of the force generated in the solder portions 10 on the signal electrodes 3 to be applied in the lower direction in FIGS. 1 and 2 and the self-weight of the acceleration sensor package 8. That is, the clearance between the package body 1 and the circuit board 9 is determined in accordance with the above-mentioned equilibrium condition. The solder portions 10 on the dummy electrodes 5 serve as spacers for retaining the above-mentioned clearance between the signal electrodes 3 and the wiring pattern 9a.

Figure 8:
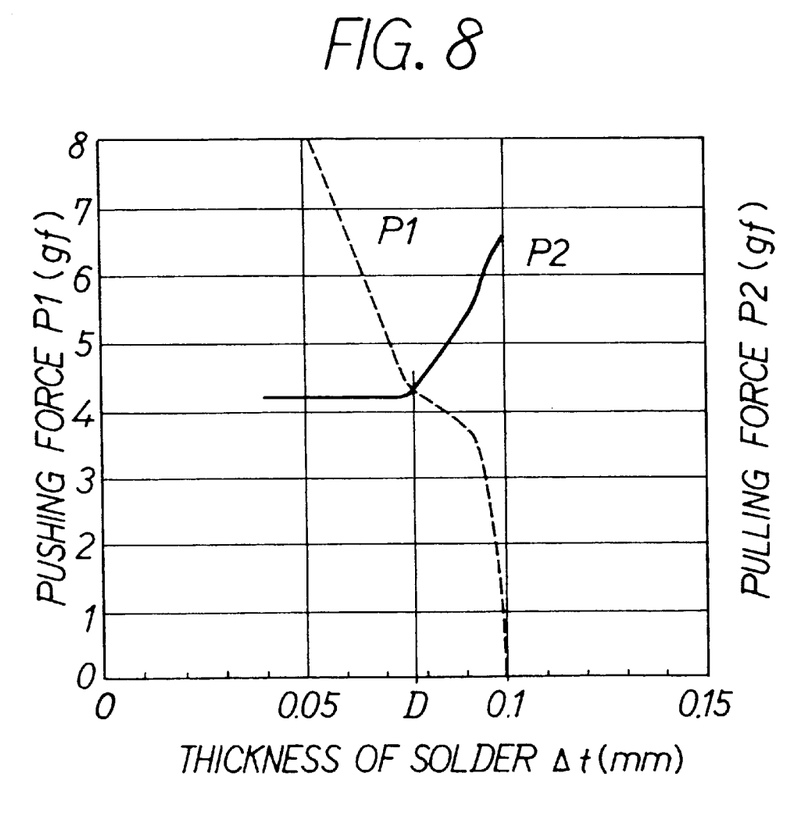
FIG. 8 is a graph showing relationship between forces applied to the package body in upper and lower directions in FIGS. 1 and 2 and a thickness of solder in the first embodiment.

FIG. 8 shows results of calculations indicating relationships of a pushing force P1 and a pulling force P2 with respect to thickness of solder, wherein the pushing force P1 represents the force applied to the package body 1 in the upper direction, and the pulling force P2 represents the force applied to the package body 1 in the lower direction.

According to the results shown in FIG. 8, a required thickness D of the solder is obtained when the forces P1 and P2 are equal to each other.

According to this embodiment, the solder portions 10 on the dummy electrodes 5 can ensure the clearance between the package body 1 and the circuit board 9. That is, by only forming the dummy electrodes 5 on the package body 1, the clearance between the package body 1 and the circuit board 9, i.e., the thickness of the solder portions 10 can be secured in a required state. Because of this, even if the self-weight of the acceleration sensor package 8 is large, the decrease more than necessary of the thickness of the solder portions 10 between the package body 1 and the circuit board 9 can be prevented. As a result, thermal stress caused by a difference in thermal expansion coefficient between the package body 1 and the circuit board 9 can be efficiently absorbed by the solder portions 10, and the possibility that the thermal fatigue failure is generated in the solder portions 10 is low. As a result, reliability of the acceleration sensor package 8 at the mounted state can be improved to be sufficient for being applied to, for example, a vehicle that is used under hard environmental conditions.

The dummy electrodes 5 are not required to have high contact reliability as for BGA package electrodes, but to secure the thickness of the solder. Therefore, it is not necessary for the dummy electrodes 5 to use extra solder balls and the like, so that the dummy electrodes 5 do not deteriorate mounting performance of the sensor package 8. Further, in this embodiment, because the dummy electrodes 5 and the lands 9b respectively have circular shapes, the internal pressures of the solder portions 10 interposed between the dummy electrodes and the lands 9b have magnitudes larger than those in the other cases where the dummy electrodes 5 have shapes other than circle. Accordingly, the solder portions 10 on the dummy electrodes 5 can sufficiently exhibits the function as the spacers to securely retain the thickness between the signal electrodes 3 and the wiring pattern 9a. Furthermore, because the four dummy electrodes 5 are symmetrically arranged on the mounted surface of the package body 1 with respect to the center of the mounted surface, the internal pressures of the solder portions 10 on the dummy electrodes 5 are uniformly applied to the package body 1. As a result, the thickness of the solder between the signal electrodes 3 and the wiring pattern 9a can be uniformly secured.

Figure 9:
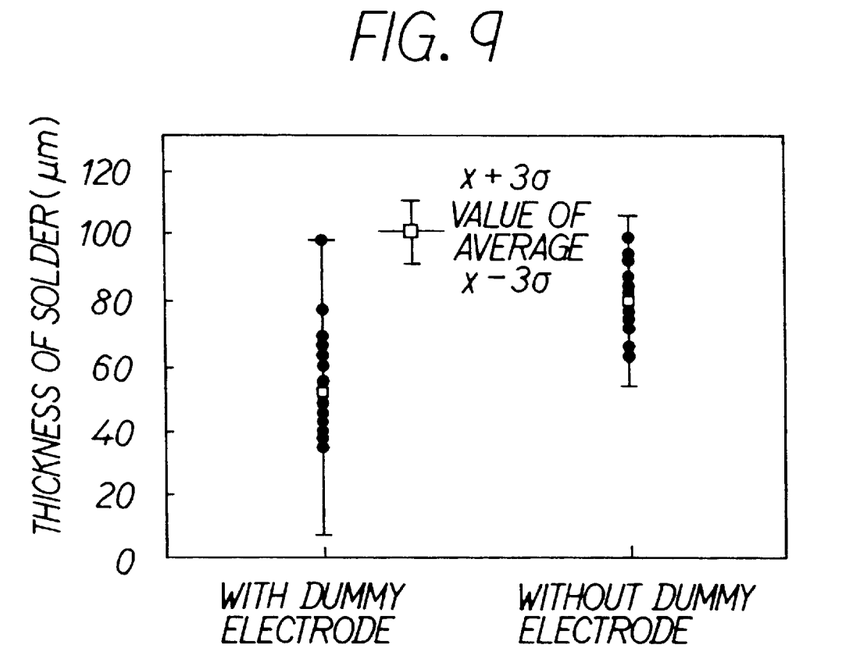
FIG. 9 is a graph sowing distribution states of thicknesses of solder in cases where dummy electrodes are formed and are not formed on the package body, in the first embodiment.

FIG. 9 shows a difference in thickness of solder portions between the package body 1 and the circuit board 9 in both cases where the dummy electrodes 5 are formed and are not formed on the package body 1. To obtain the results shown in FIG. 9, several samples were prepared and each thickness of the solder portions of the samples was measured. As understood from the results of FIG. 10, by employing the dummy electrodes 5, the effect that the thickness of the solder portions between the package body 1 and the circuit board 9 is increased compared to the other case in which the dummy electrodes 5 are not employed can be expected.

In this embodiment, when mounting the package body 1 on the circuit board 9, the solder can be supplied to the dummy electrodes 5 in the same process for supplying the solder to the signal electrodes 3, resulting in simplification of the mounting process.

Figure 10:
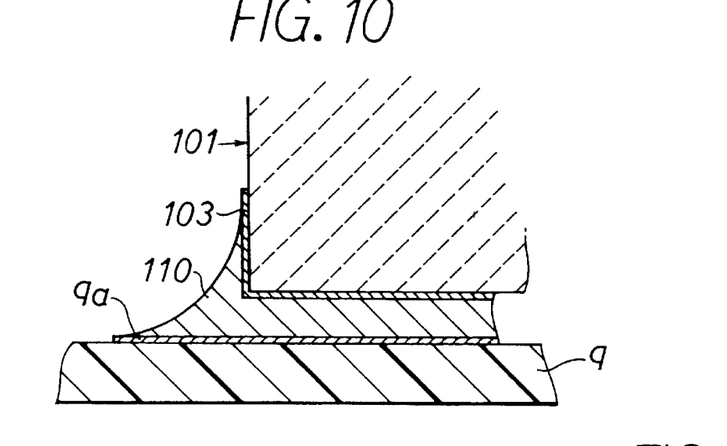
FIG. 10 is a partially cross-sectional view showing an example of a package body, for explaining an effect in the first embodiment.

Further, the package body 1 has the chamfered portions 1a on the both sides of the mounted surface thereof, and the auxiliary signal electrodes 4 are formed on the chamfered portions 1a to be integrally connected to the signal electrodes 3. Accordingly, the following features and effects can be obtained. That is, as shown in FIG. 10 as an example, when assuming that a package body 101 does not have chamfered portions on a mounted surface thereof and a signal electrode 103 has an extending portion on a side face of the package body 101, a solder portion 110 contacting the extending portion of the signal electrodes 103 has surface tension applied to the package body 101 in the lower direction in FIG. 1 (direction parallel to the side face of the package body 101) when a wetting angle of the solder portion 110 is approximately zero. As a result, the force pulling the package body 101 in the lower direction is increased.

As opposed to this, when the auxiliary signal electrodes 4 are formed on the package body 1 in a tapered state with respect to the mounted surface of the package body 1, as in the first embodiment, each of the solder portions 10 contacting the auxiliary signal electrodes 4 has surface tension that is applied to the package body 1 in the tapered direction even when the wetting angle is approximately zero. Therefore, a component of force applied to the package body 1 in the lower direction is relatively reduced. That is, the force pulling the package body 1 in the lower direction is reduced, so that the thickness of the solder can be easily secured so that the reliability of the acceleration sensor package 8 in the mounted state thereof is improved.

Figure 11:
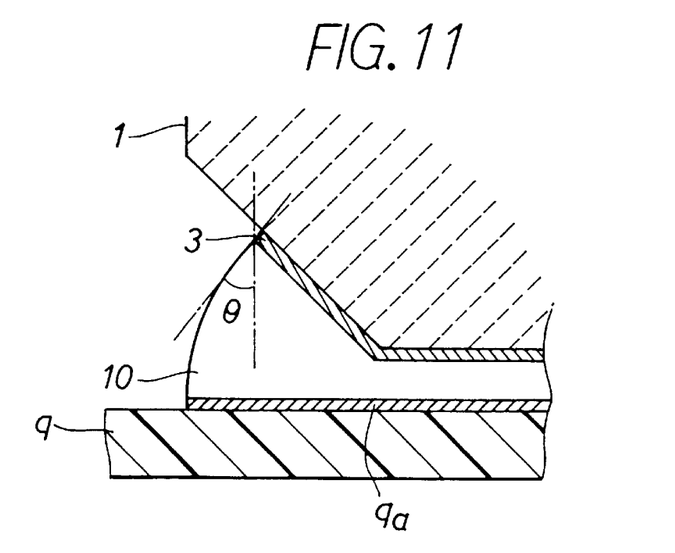
FIG. 11 is a partially cross-sectional view showing a solder portion on an auxiliary electrode for explaining a wetting angle of the solder portion in the first embodiment.
Figure 12:
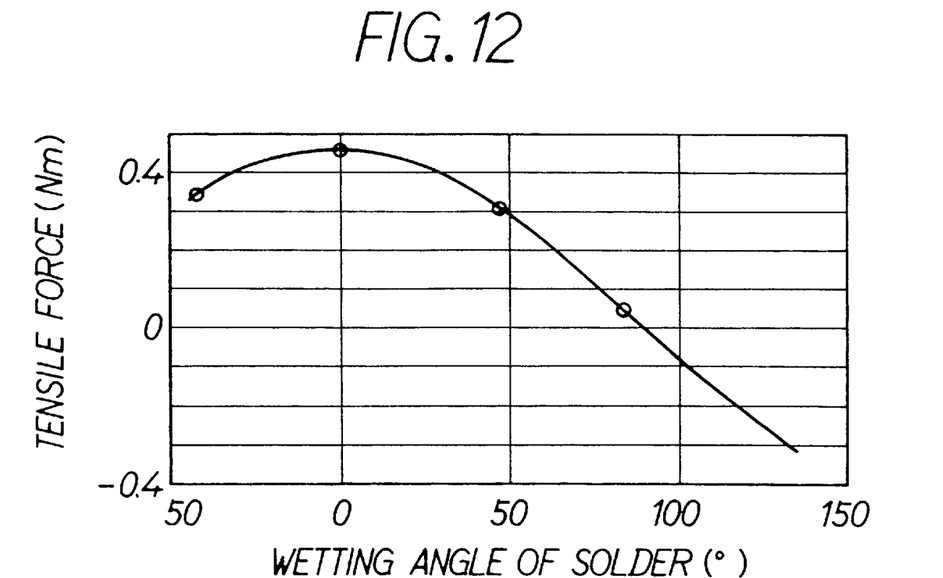
FIG. 12 is a graph showing a relationship between a force applied to the package body and the wetting angle of the solder portion in the first embodiment.

The magnitude and the direction of the force caused by the surface tension of each of the solder portions 10 on the auxiliary signal electrodes 4 change in accordance with wetting angle of the solder portion 10. The wetting angle of the solder portion 10 is, as shown in FIG. 11, an angle e between a perpendicular line with respect to the mounted surface and a tangential line with respect to a side face of the solder portion 10 in cross section. FIG. 12 indicates a relationship between a tensile force generated in the solder portion 10 contacting a corresponding one of the auxiliary signal electrodes 4 and a wetting angle of the solder portion 10. The tensile force is a force imparted from the entire circumference of the solder portion 10. When the tensile force is positive, the force pushes the package body 1 in the upper direction, and when the tensile force is negative, the force pulls the package body 1 in the lower direction. The result shown in FIG. 12 is an example when the auxiliary signal electrodes 4 were formed on the chamfered portions 1a having a tapered angle of approximately 45°.

In the above-mentioned reflow treatment, the solder paste between the signal electrodes 3 and the wiring pattern 9a is extruded toward the auxiliary signal electrode side, and then the solder portions 10 contacting the auxiliary signal electrodes 4 and having wetting angles relatively large are formed as shown in FIG. 1. In such a case, according to FIG. 12, a component in the lower direction of the force accompanying the surface tension of each of the solder portions 10 and applied to the interface between the solder portion 10 and the corresponding auxiliary signal electrode 4 (force pulling the package body 1 in the lower direction) is reduced. When the wetting angle of the solder portion 10 is sufficiently large, the force is applied to the package body 1 in the upper direction. Accordingly, a self adjusting function with respect to the thickness of the solder portion 10 can be obtained, resulting in stabilization of the thickness of the solder portion 10. Further, even if the wetting angle of the solder portions 10 on the auxiliary signal electrodes 4 is not so large, because the auxiliary signal electrodes 4 are formed on the chamfered portions 1a with a tapered angle with respect to the mounted surface of the package body 1, the component in the lower direction of the force applied to the interface between the solder portions 10 and the auxiliary signal electrodes 4 is reduced compared to the other case where the chamfered portions 1a are not employed.

On the other hand, in the above-mentioned reflow treatment, because the solder paste on the wiring pattern 9a spreads to the auxiliary signal electrodes 4, the wetting state of the solder paste at the auxiliary signal electrodes 4 can be observed from the appearance of the package body 1. Accordingly, the bonding state in the entire acceleration sensor package 8 by the solder can be easily anticipated from the result of the appearance test performed on the auxiliary signal electrodes 4, resulting in decrease percent defective and improvement of reliability of the mounting performance of the acceleration sensor package 8.

In this case, on the contrary, the effect can be considered in the following way. That is, because the auxiliary signal electrodes 4 are partially formed on the chamfered portions 1a to have constitution sufficient for enabling the appearance test thereof, the amount of the solder past spread to the auxiliary signal electrodes 4 is increased, so that the wetting angles of the solder portions 10 of the auxiliary signal electrodes 4 becomes large. As a result, the force applied to the interface between the solder portions 10 and the auxiliary signal electrodes 4 in the lower direction is reduced.

(Second Embodiment)

Figure 13:
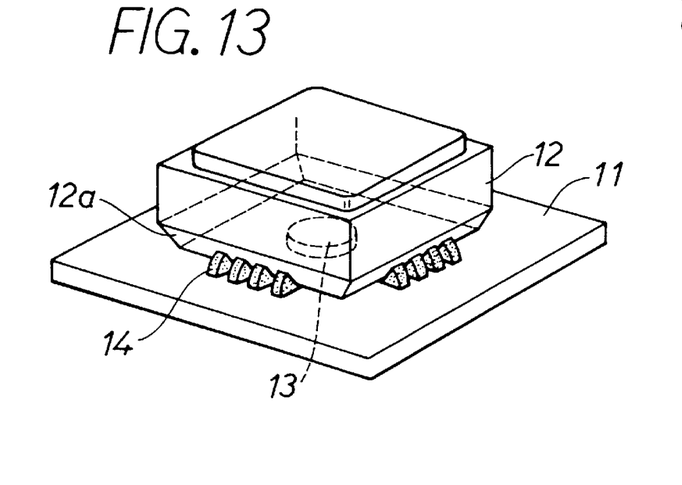
FIG. 13 is a perspective view showing an acceleration sensor package in a preferred second embodiment according to the present invention.

In the first embodiment, although four dummy electrodes 5 are formed on the package body 1, it will be apparent that changes in form and detail may be made without departing from the scope of the invention. For example, as shown in FIG. 13, when adopting a quad-type package body 12 having signal electrodes (not shown) that are to be taken out from four sides of the package body 12 in a state mounted on a circuit board 11, only one dummy electrode 13 having a circular shape may be disposed on a central portion of the mounted surface (bottom face) of the package body 12. In this case, chamfered portions 12a are formed on the four sides of the mounted surface of the package body 12, and auxiliary signal electrodes (not shown) are formed on the chamfered portions 12a. FIG. 13 shows a state where solder 14 is extruded out to the auxiliary signal electrodes.

While the present invention has been shown and described with reference to the foregoing preferred embodiment, it will be apparent to those skilled in the art that the other changes in form and detail may be made therein without departing from the scope of the invention as defined in the appended claims.

The dummy electrodes 5 and 13 in the first and second embodiments respectively have circular shapes, and it is desired that the dummy electrodes have circular shapes, because the dummy electrodes having the circular shapes can exhibit large internal pressure compared to the other shapes. For example, when a dummy electrode has a rectangular shape, the internal pressure generated in a solder portion on the dummy electrode is very small, because one of radiuses of curvature R2 in the above-mentioned Laplace-Young formula is infinite. There may be a case that the internal pressure of the solder portion having a rectangular shape has a half magnitude compared to the dummy electrode having a circular shape. However, it is apparent that the other shapes such as the rectangular shape may be adopted to the dummy electrodes in accordance with a shape of the package body, a number of the signal electrodes, and the like.

Although the present invention is applied to the surface mount type semiconductor package unit for mounting semiconductor devices thereon such as the semiconductor sensor chip 2a and the sensor processing IC 2b, it may be applied to a surface mount type package unit for mounting passive devices thereon such as a resistor network and an RC network. The sensor package 8 in the above-mentioned embodiments holds the acceleration sensor circuit 2 therein as the acceleration sensor package as an example, however, it may hold therein a sensor circuit capable of converting a dynamic amount such as pressure into an electrical signal as a dynamic amount sensor package, and may hold therein the other circuit for a temperature sensor, a magnetic sensor, a radiation sensor, or the like.

In the above mentioned embodiments, the solder paste is provided on the circuit board 9. However, it is possible to form solder bumps on the signal electrodes 3 as well as on the dummy electrodes 5 of the package body 1 in advance. As a material for the electrodes 3, 4, and 5, general conductive materials such as copper, silver, gold, aluminum, and nickel are applicable in addition to tungsten. Although the electrodes 3, 4, and 5 are formed by screen printing, it is apparent that they can be formed by the other methods such as pad-printing, plating, roll leaf hot stamping and the like.

Variations such as those described above are to be understood as being within the scope of the present invention as defined by the appended claims.

What is claimed is:

1. A surface mount type package unit comprising:
   a circuit board;
   a conductive member provided on the circuit board;
   a package body having a mounted surface and mounted on the circuit board with the mounted surface facing the circuit board through the conductive member;
   a circuit element held on the package body;
   a signal electrode provided on the mounted surface of the package body adjacently to an end portion of the mounted surface and electrically connected to the circuit element, the signal electrode directly connected to the conductive member of the circuit board through solder; and
   a dummy electrode provided on the mounted surface of the package body and connected to the conductive member of the circuit board through solder;
   wherein the solder between the signal electrode and the conductive member is exposed to an outside of the mounted surface of the package body when the signal electrode is joined to the conductive member through the solder; and
   wherein a clearance between the package body and the circuit board is held by an internal pressure generated in the solder between the dummy electrode and the conductive member in a fused state of the solder.

2. The surface mount type package unit according to claim 1, wherein the signal electrode has a shape extending from a center portion of the mounted surface to an end portion of the mounted surface.

3. The surface mount type package unit according to claim 1, wherein:
   the mounted surface of the package body has a chamfered portion on a verge portion thereof;
   an auxiliary electrode is provided on the chamfered portion to be connected to the signal electrode; and
   the auxiliary electrode is joined to the conductive member of the circuit board by the solder when the signal electrode is joined to the conductive member by the solder.

4. The surface mount type package unit according to claim 1, wherein the circuit board has a main surface on which the package body is mounted, and the main surface of the circuit board is substantially parallel to the mounted surface of the package body.

5. The surface mount type package unit according to claim 1, wherein an area of the mounted surface of the package body is the largest of all surfaces of the package body.

6. The surface mount type package unit according to claim 1, wherein the dummy electrode has a circular shape.

7. The surface mount type package unit according to claim 1, wherein the dummy electrode includes a plurality of dummy electrode members, and the dummy electrode members are arranged on the mounted surface symmetrically with respect to a center of the mounted surface.

8. The surface mount type package unit according to claim 1, wherein the auxiliary electrode is partially provided on the chamfered portion at a position adjacent to the mounted surface of the package body.

9. The surface mount type package unit according to claim 1, wherein the circuit element includes a circuit for processing an electrical signal of a sensor.

10. The surface mount type package unit according to claim 9, wherein the circuit element includes an element for converting a dynamic amount into an electrical signal.

11. The surface mount type package unit according to claim 10, wherein the dynamic amount is an amount of acceleration.

12. A method for manufacturing a surface mount type package unit including a package body directly mounted on a circuit board through solder, the method comprising steps of:
   forming a signal electrode on a mounted surface of the package body;
   forming a dummy electrode on the mounted surface of the package body to be in a non-contacting state with respect to the signal electrode;
   chamfering a verge portion of the mounted surface to form a chamfered portion;
   forming an auxiliary electrode on the chamfered portion to contact the signal electrode;
   preparing the circuit board having a conductive member on a surface thereof; and
   bonding the signal electrode, the dummy electrode and the auxiliary electrode of the package body to the conductive member of the circuit board by fused solder.

13. The method for manufacturing a surface mount type package unit according to claim 12, the signal electrode and the dummy electrode are formed in the same process.

14. The method for manufacturing a surface mount type package unit according to claim 12, wherein the dummy electrode is formed into a circular shape.

15. The method for manufacturing a surface mount type package unit according to claim 12, wherein the dummy electrode is composed of a plurality of dummy electrode members, and the plurality of dummy electrode members are formed on the mounted surface of the package body with a symmetrical arrangement with respect to a center of the mounted surface.

16. The method for manufacturing a surface mount type package unit according to claim 12, wherein the auxiliary electrode is partially formed on the chamfered portion at a position adjacent to the mounted surface.

17. A surface mount type package unit comprising:
   a circuit board;

first and second conductive members provided on the circuit board;

a package body mounted on the circuit board via the first and second conductive members, the package body having a mounted surface facing the circuit board and a secondary surface adjacent to the mounted surface, the secondary surface being non-parallel to the mounted surface;

a circuit element held on the package body;

a signal electrode provided on the mounted surface of the package body to face the first conductive member of the circuit board, and electrically connected to the circuit element;

a first solder portion provided between the signal electrode and the first conductive member to make contact between the signal electrode and the first conductive member;

an auxiliary electrode provided on the secondary surface of the package body to face the first conductive member, and integrally connected to the signal electrode;

a auxiliary solder portion provided between the auxiliary electrode and the first conductive member, and integrally connected to the first solder portion;

a dummy electrode provided on the mounted surface of the package body to face the second conductive member of the circuit board, and electrically insulated from the signal electrode and the first conductive member; and a second solder portion provided between the dummy electrode and the second conductive member.

18. The surface mount type package unit according to claim 17, wherein the secondary surface is a chamfered portion of the mounted surface.

19. The surface mount type package unit according to claim 17, wherein the auxiliary solder portion is exposed to the outside of the package unit.

20. The surface mount type package unit according to claim 17, wherein the dummy electrode has a circular shape.

21. The surface mount type package unit according to claim 20, wherein the second solder portion has a barrel-like shape.

* * * * *